(12) United States Patent
Takahashi (10) Patent No.: US 9,190,978 B2
(45) Date of Patent: Nov. 17, 2015

(54) DIFFERENTIAL TRANSMISSION CIRCUIT AND PRINTED CIRCUIT BOARD

(75) Inventor: Yasuhiro Takahashi, Ageo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/239,037

(22) PCT Filed: Aug. 7, 2012

(86) PCT No.: PCT/JP2012/005006
§ 371 (c)(1),
(2), (4) Date: Feb. 14, 2014

(87) PCT Pub. No.: WO2013/027349
PCT Pub. Date: Feb. 28, 2013

(65) Prior Publication Data
US 2014/0176252 A1    Jun. 26, 2014

(30) Foreign Application Priority Data

Aug. 19, 2011  (JP) ................................. 2011-179665
Jul. 18, 2012   (JP) ................................. 2012-159460

(51) Int. Cl.
*H04B 3/28*  (2006.01)
*H03H 7/42*  (2006.01)
*H03H 1/00*  (2006.01)

(52) U.S. Cl.
CPC ....... *H03H 7/427* (2013.01); *H03H 2001/0085* (2013.01)

(58) Field of Classification Search
CPC ................................ H04B 15/00; H04B 15/02
USPC ................ 333/4, 12, 131, 172, 177, 178, 181
See application file for complete search history.

(56) References Cited

U.S. PATENT DOCUMENTS 3,996,537 A * 12/1976 Neuman ........................ 333/177
4,342,013 A *  7/1982 Kallman ....................... 333/181

(Continued)

FOREIGN PATENT DOCUMENTS

| JP | H04-372213 A1 | 12/1992 |
|----|---------------|---------|
| TW | 200409574 A   | 6/2004  |
| TW | 201003889 A   | 1/2010  |

OTHER PUBLICATIONS

Shuo Wang et al. "Effects of Parasitic Parameters on EMI Filter Performance;" IEEE Transactions on Power Electronics, vol. 19, No. 3, May 2004; 869-877.

*Primary Examiner* — Jeffrey Zweizig
(74) *Attorney, Agent, or Firm* — Canon USA, Inc. IP Division (57) ABSTRACT

A differential transmission circuit includes differential signal transmission and reception units connected by a differential signal wiring having an inductor unit composed of magnetically coupled first and second inductors provided on first and second signal lines, an input-side capacitor unit including a first input-side capacitor having one terminal connected to a first inductor signal input terminal and the other terminal grounded and a second input-side capacitor having one terminal connected to a second inductor signal input terminal and the other terminal grounded, and an output-side capacitor unit including a first output-side capacitor having one terminal connected to a first inductor signal output terminal and the other terminal grounded and a second output-side capacitor having one terminal connected to a second inductor signal output terminal and the other terminal grounded.

7 Claims, 8 Drawing Sheets

(56) References Cited

U.S. PATENT DOCUMENTS

| | | | |
|---|---|---|---|
| 4,910,482 A * | 3/1990 | Takagai et al. | 333/181 |
| 5,061,913 A * | 10/1991 | Okochi et al. | 333/181 |
| 5,083,101 A * | 1/1992 | Frederick | 333/181 |
| 5,210,519 A | 5/1993 | Moore | |
| 7,589,605 B2 * | 9/2009 | Perreault et al. | 333/177 |
| 2009/0128258 A1 | 5/2009 | Xu | |

\* cited by examiner

DIFFERENTIAL TRANSMISSION CIRCUIT AND PRINTED CIRCUIT BOARD

TECHNICAL FIELD

The present invention relates to a differential transmission circuit applied to a digital data transmission system of an electric and electronic device, a control device, and the like, and a printed circuit board.

BACKGROUND ART

Multifunctional devices and digital cameras of recent years transmit large volumes of digital signals at a high speed in response to demands for a higher speed and a higher brilliance. To transmit the large volumes of data at a high speed, the number of transmission paths is increased or a transmission speed is increased. For the former case, the number of transmission paths that can be increased is limited in a downsized and high density electronic printed wiring board. Also, in the case of the transmission via a cable, an increase in the wiring number of cables directly causes a cost increase. Furthermore, a fluctuation in timings between signals is conspicuous by a skew along with an improvement in the transmission speed, and it is difficult to satisfy setup/hold. For that reason, a differential serial transmission system capable of transmitting the large volumes of data at a high speed with the fewer transmission paths is being widely used. In the differential serial transmission system, low speed parallel signals such as data, addresses, and control lines from a transmission side IC are serialized and output as differential signals to the transmission paths, and the serial signals as the transmitted differential signals are deserialized on a reception side IC to be converted into the parallel signals. It is noted that clock signals transmitted from the transmission side IC to the reception side IC may be of a clock embedded-type transmission system in which the clock signals are included in the above-described parallel signals to be serialized and transmitted or a transmission system or a clock independent-type transmission system in which only the clock signals are transmitted separately, apart from the above-described parallel signals.

On the other hand, in a case where the high speed signals are transmitted on a long lossy transmission path such as the cable, electromagnetic waves are emitted by harmonic components included in the differential signals while the cable functions as an antenna, which may affect operations of other devices. For that reason, electromagnetic interference (EMI) from the device is to be suppressed.

Figure 8A:
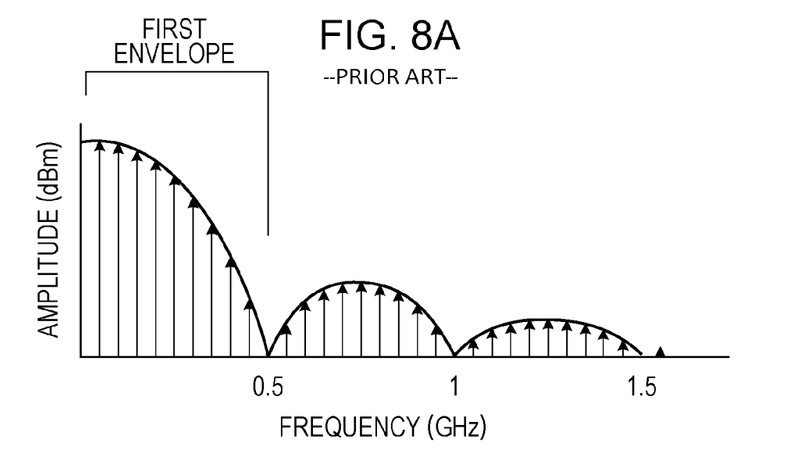
FIG. 8A is a graphic representation illustrating a spectrum of a normal mode component of the transmitted signal.

Also, the data signals are transmitted by way of rectangular waves in the serial transmission. FIG. 8A conceptually illustrates a spectrum of a normal mode component of the transmitted signal. As may be understood from FIG. 8A, the spectrum of the normal mode component is represented by a sinc function. Here, in the serial transmission at a high speed, a bare minimum spectrum of the normal mode for data reproduction on the reception side IC is a first envelope part in FIG. 8A.

Figure 8B:
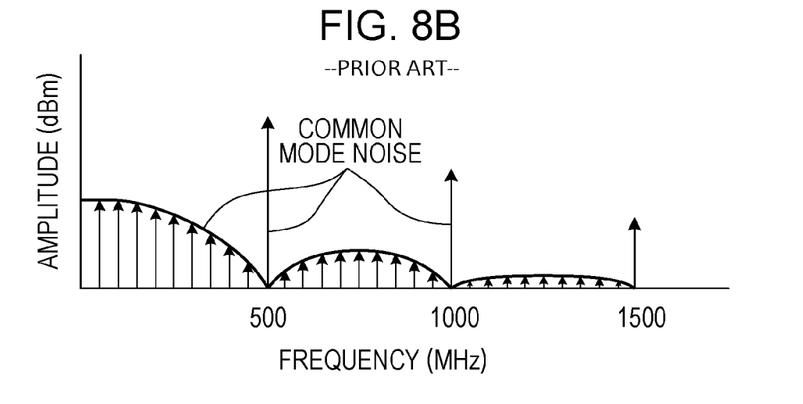
FIG. 8B is a graphic representation illustrating a spectrum of a common mode component of the transmitted signal.

On the other hand, FIG. 8B conceptually illustrates a spectrum of a common mode component of the transmitted signal. The common mode component is a component that causes a problem as radiation noise, which is generated from unbalance of the differential signals. In FIG. 8B, when a frequency is at 500 MHz, 1 GHz, and 1.5 GHz, very large signals of the common mode component are generated. These frequencies at 500 MHz, 1 GHz, and 1.5 GHz are frequencies where the signal of the normal mode component becomes zero in FIG. 8A. That is, at the frequency where the spectrum of the normal mode signal illustrated in FIG. 8A disappears, the signal of the common mode component with a large amplitude is generated.

It is described in PTL 1 that a band limiting on the data spectrum is carried out by using a low-pass filter (LPF) so that an intersymbol interference does not occur because a frequency band provided to the transmission path used for the serial transmission is not regarded as indefinite.

Figure 8C:
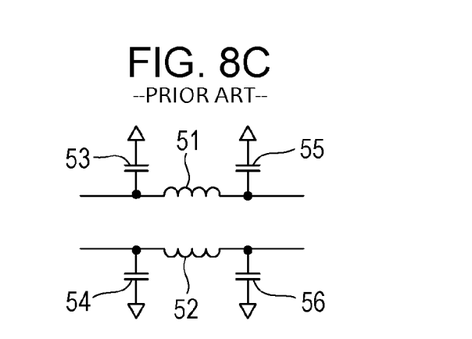
FIG. 8C is a circuit diagram of a configuration of the related art low-pass filter.

FIG. 8C illustrates a simplified configuration of the LPF described in PTL 1. In FIG. 8C, one of the differential serial signal transmission paths is structured by an inductor 51 and a pair of pi-type filters composed of two capacitors 53 and 55. In addition, the other differential serial transmission path is structured by an inductor 52 and a pair of pi-type filters composed of two capacitors 54 and 56. This LPF is inserted between a differential signal transmission unit and a differential signal reception unit, and a cutoff frequency is set as a maximum frequency of the first envelope, so that a frequency component higher than the first envelope is removed. According to this, a high-pass unused spectrum is removed with respect to the normal mode component, and a high-pass unused spectrum is removed at the same characteristics also with respect to the common mode component.

However, in the above-described related art LPF, the common mode component is also suppressed at a performance equivalent to the suppression of the normal mode component in the unused high frequency band, but the common mode component that becomes the cause of the radiation noise also exists in a frequency band lower than or equal to the cutoff frequency of the LPF. To elaborate, in the related art LPF, since the suppression with respect to the common mode component in the frequency band of the first envelope is insufficient, a further improvement in the LPF is sought after.

CITATION LIST

Patent Literature

PTL 1: Japanese Patent Laid-Open No. 4-372213

SUMMARY OF INVENTION

The present invention provides a differential transmission circuit in which the common mode component that becomes the cause of the radiation noise from the signal line is largely attenuated while the normal mode component in the high frequency band unused for the transmission is attenuated.

A differential transmission circuit according to an aspect of the present invention includes: a differential signal transmission unit configured to transmit a differential signal; a differential signal reception unit configured to receive the differential signal; a differential signal wiring composed of a first signal line and a second signal line and configured to connect the differential signal transmission unit and the differential signal reception unit to each other; an inductor unit composed of a first inductor provided on the first signal line and a second inductor provided on the second signal line; an input-side capacitor unit composed of a first input-side capacitor in which one terminal is connected to a signal input terminal of the first inductor and the other terminal is connected to ground and a second input-side capacitor in which one terminal is connected to a signal input terminal of the second inductor and the other terminal is connected to ground; and an output-side capacitor unit provided between the inductor unit and the differential signal reception unit and configured to attenuate a normal mode component included in the differential signal in cooperation with the inductor unit and the input-side capacitor unit, in which the first inductor and the second inductor are magnetically coupled to each other.

Further features of the present invention will become apparent from the following description of exemplary embodiments with reference to the attached drawings.

DESCRIPTION OF EMBODIMENTS

Hereinafter, exemplary embodiments for carrying out the present invention will be described in detail with reference to the drawings.

First Exemplary Embodiment

Figure 1:
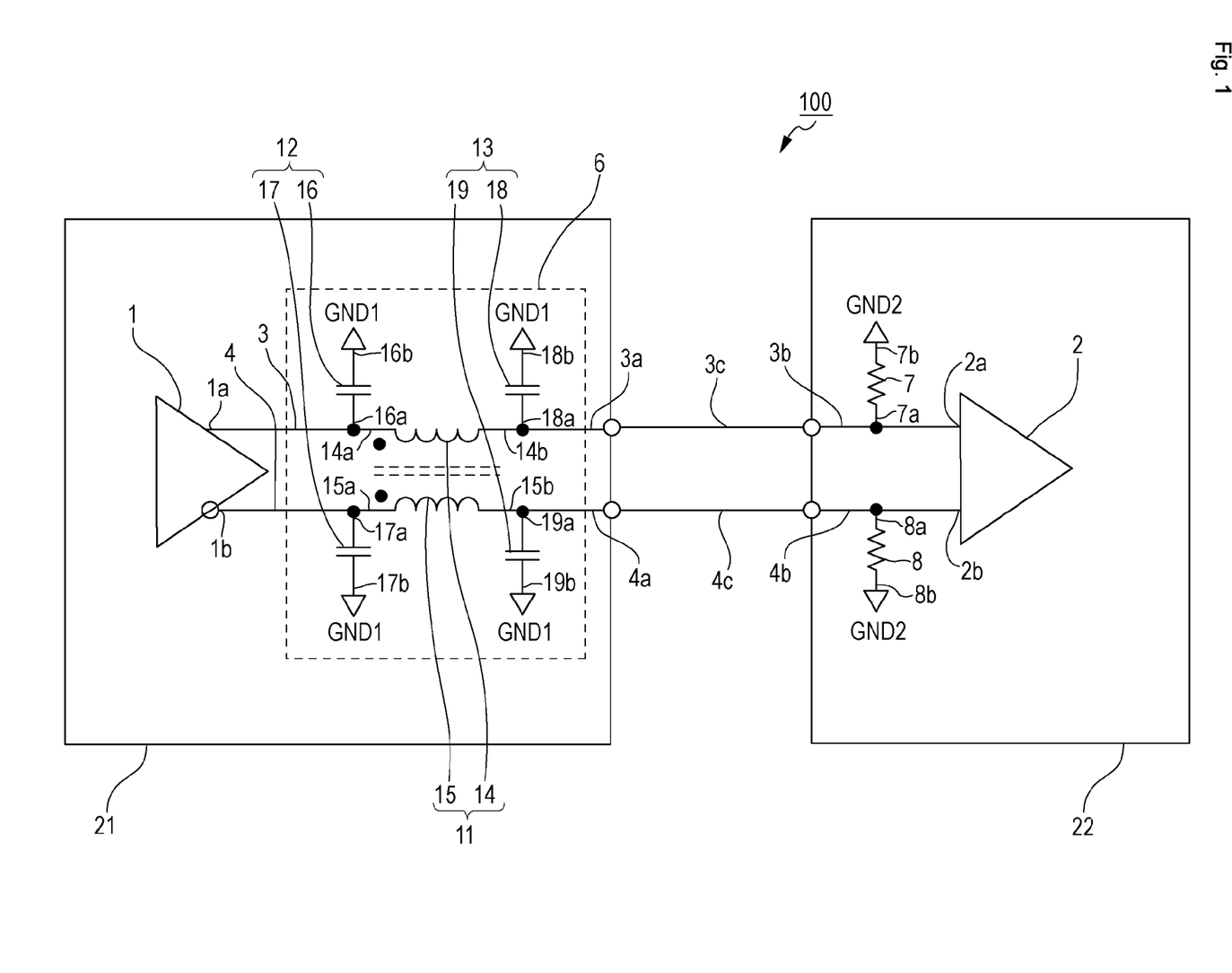
FIG. 1 is a circuit diagram of a schematic configuration of a differential transmission circuit according to a first exemplary embodiment.

FIG. 1 is a circuit diagram of a schematic configuration of a differential transmission circuit according to a first exemplary embodiment of the present invention. A differential transmission circuit 100 includes a differential signal transmission unit 1 composed of a semiconductor element, a differential signal reception unit 2 composed of a semiconductor element, and a first signal line 3 and a second signal line 4 that electrically connect the differential signal transmission unit 1 to the differential signal reception unit 2. To be specific, a first transmission terminal 1a functioning as a first transmission terminal of the differential signal transmission unit 1 is electrically connected to a first reception terminal 2a functioning as a first reception terminal of the differential signal reception unit 2 by the first signal line 3. In addition, a second transmission terminal 1b functioning as a second transmission terminal of the differential signal transmission unit 1 is electrically connected to a second reception terminal 2b functioning as a second reception terminal of the differential signal reception unit 2 by the second signal line 4.

The differential signal transmission unit 1 outputs the differential signals to the pair of signal lines 3 and 4, so that the differential signals are transmitted to the differential signal reception unit 2. The differential signal reception unit 2 receives the differential signals transmitted from the differential signal transmission unit 1. The differential signals are digital signals and serial signals obtained by serializing data. Then, among the differential signals, a signal component transmitted through the first signal line 3 and a signal component transmitted through the second signal line 4 have mutually opposite phases. The differential signal reception unit 2 determines a voltage level (high level or low level) of the differential signal from a difference in voltages of these signal components and reproduces the data.

The differential signal transmission unit 1 is mounted to a first printed wiring board 21 to form a first printed circuit board, and the differential signal reception unit 2 is mounted to a second printed wiring board 22 to form a second printed circuit board. Therefore, the first and second signal lines 3 and 4 are differential transmission paths composed of conductive patterns 3a and 4a formed on the first printed wiring board 21, conductive patterns 3b and 4b formed on the second printed wiring board 22, and cables 3c and 4c connecting these conductive patterns.

In addition, the differential transmission circuit 100 is provided with a low-pass filter 6 arranged on the first and second signal lines 3 and 4 and first and second terminating resistors 7 and 8. The low-pass filter 6 is provided in the vicinity of the differential signal transmission unit 1, the terminating resistors 7 and 8 are provided in the vicinity of the differential signal reception unit 2. To be more specific, the low-pass filter 6 is mounted to the first printed wiring board 21, and the terminating resistors 7 and 8 are mounted to the second printed wiring board 22. A terminal (one terminal) 7a of terminals of the first terminating resistor 7 is connected to a first reception terminal 2a of the differential signal reception unit 2, and a different terminal (the other terminal) 7b is connected to a ground GND2. In addition, a terminal (one terminal) 8a of the second terminating resistor 8 is connected to a second reception terminal 2b of the differential signal reception unit 2, and a different terminal (the other terminal) 8b is connected to the ground GND2.

The low-pass filter 6 is composed by including an inductor unit 11, an input-side capacitor unit 12 provided on an input side of the inductor unit 11, and an output-side capacitor unit 13 provided on an output side of the inductor unit 11.

The inductor unit 11 is composed by including a first inductor 14 provided to the first signal line 3 and a second inductor 15 provided to the second signal line 4. The inductors 14 and 15 are provided in serial to the signal lines 3 and 4, terminals (one terminals) 14a and 15a of the inductors 14 and 15 function as signal input terminals, different terminals (the other terminals) 14b and 15b function as signal output terminals. The inductors 14 and 15 are coils (first and second coils) formed by winding a conductive line in a helical manner in a same winding direction.

The input-side capacitor unit 12 is composed of two input-side capacitances 16 and 17. In the first input-side capacitance 16, a terminal (one terminal) 16a is electrically connected to a signal input terminal 14a of the first inductor 14, and a different terminal (the other terminal) 16b is electrically connected to a ground GND1. In addition, in the second input-side capacitance 17, a terminal (one terminal) 17a is electrically connected to a signal input terminal 15a of the second inductor 15, and a different terminal (the other terminal) 17b is electrically connected to the ground GND1.

The output-side capacitor unit 13 is provided on an opposite side with respect to the differential signal transmission unit as viewed from the inductor unit 11 and composed of two output-side capacitances 18 and 19 according to the first exemplary embodiment. In the first output-side capacitance 18, a terminal (one terminal) 18a is electrically connected to a signal output terminal 14b of the first inductor 14, and a different terminal (the other terminal) 18b is electrically connected to the ground GND1. In addition, in the second output-side capacitance 19, a terminal (one terminal) 19a is electrically connected to a signal input terminal 15b of the second inductor 15, and a different terminal (the other terminal) 19b is electrically connected to the ground GND1.

It is noted that the respective capacitances 16, 17, 18, and 19 may be capacitance elements mounted to the printed wiring boards 21 and 22 or capacitance patterns formed by conductive patterns on the printed wiring boards 21 and 22. Also, the respective capacitances 16, 17, 18, and 19 may be a single capacitance element or capacitance pattern or may function as a single capacitance by connecting plural capacitance elements or plural capacitance patterns in parallel or in serial.

The grounds GND1 and GND2 are, for example, ground planes formed on the printed wiring boards 21 and 22 and are grounded on a metallic casing which is not illustrated in the drawing.

With the above-described configuration, the differential signal transmitted from the differential signal transmission unit 1 are transmitted via the pair of signal lines 3 and 4 (differential transmission paths), and the data is reproduced in the differential signal reception unit 2 by way of voltages generated in the terminating resistors 7 and 8 provided at the reception terminals 2a and 2b of the differential signal reception unit 2. In the differential signals transmitted from the differential signal transmission unit 1, a normal mode component including a normal mode signal used for the transmission and a common mode component that is not used for the transmission and becomes a cause of the radiation noise exist. In addition, the normal mode signal used for the transmission includes a high frequency component that may or may not be used for the data reproduction in the differential signal reception unit 2. To elaborate, a part of the first envelope illustrated in FIG. 8A is a spectrum used for the data reproduction in the differential signal reception unit 2.

On the other hand, the first input-side capacitance 16, the first inductor 14, and the first output-side capacitance 18 function as a pi-type filter with respect to the normal mode component. Furthermore, the second input-side capacitance 17, the second inductor 15, and the second output-side capacitance 19 function as a pi-type filter with respect to the normal mode component. Therefore, since the input-side capacitor unit 12, the inductor unit 11, and the output-side capacitor unit 13 functioning as the pi-type filter operate in cooperation with each other, the normal mode component (to be specific, a frequency band higher than the first envelope, that is, a high frequency band) included in the differential signal is attenuated.

Furthermore, in the first and second input-side capacitances 16 and 17 of the input-side capacitor unit 12, the common mode component is bypassed to the ground GND1. By the input-side capacitor unit 12 composed of the pair of the input-side capacitances 16 and 17, the common mode component (to be specific, the high frequency band) included in the differential signal is attenuated.

To elaborate, a design is made in a manner that electrostatic capacitances of the input-side capacitances 16 and 17 and the output-side capacitances 18 and 19 as well as inductances of the inductors 14 and 15 allow a transmission of the first envelope part illustrated in FIG. 8A so that the component having the frequency higher than the first envelope is attenuated.

Furthermore, according to the first exemplary embodiment, the first inductor 14 and the second inductor 15 are magnetically coupled to each other. For example, the inductors are formed by winding the conductive line abound a common core in a same winding direction. Therefore, the pair of inductors 14 and 15 mutually cancel magnetic fields with respect to the normal mode component so that the impedances are relatively small and the attenuation hardly occurs. In contrast, the pair of inductors 14 and 15 generate magnetic fields in a same direction with respect to the common mode component so that the impedances are relatively large and an effect of the attenuation is exhibited. To elaborate, the first and second inductors 14 and 15 (the inductor unit 11) function as a common mode choke coil.

Figure 2A:
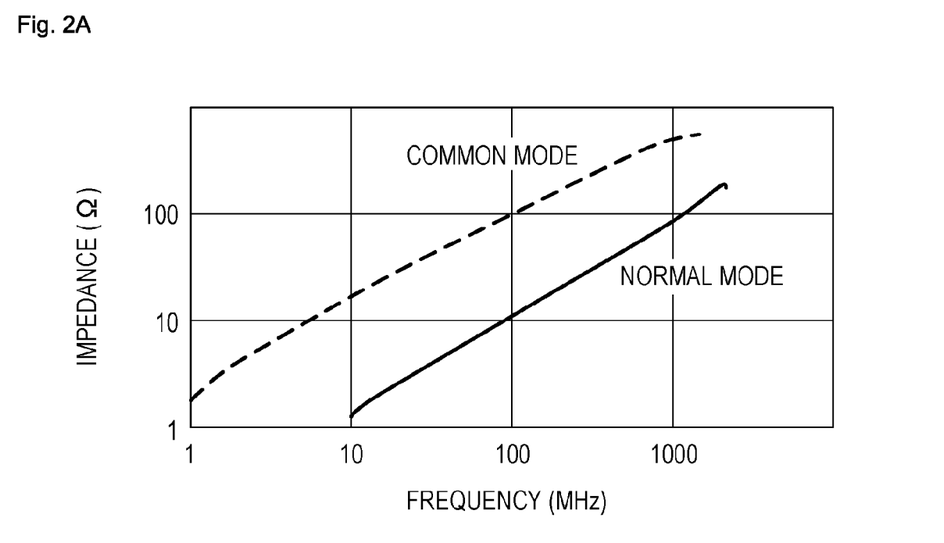
FIG. 2A is a graphic representation illustrating a character of an inductor unit according to the first exemplary embodiment.
Figure 2B:
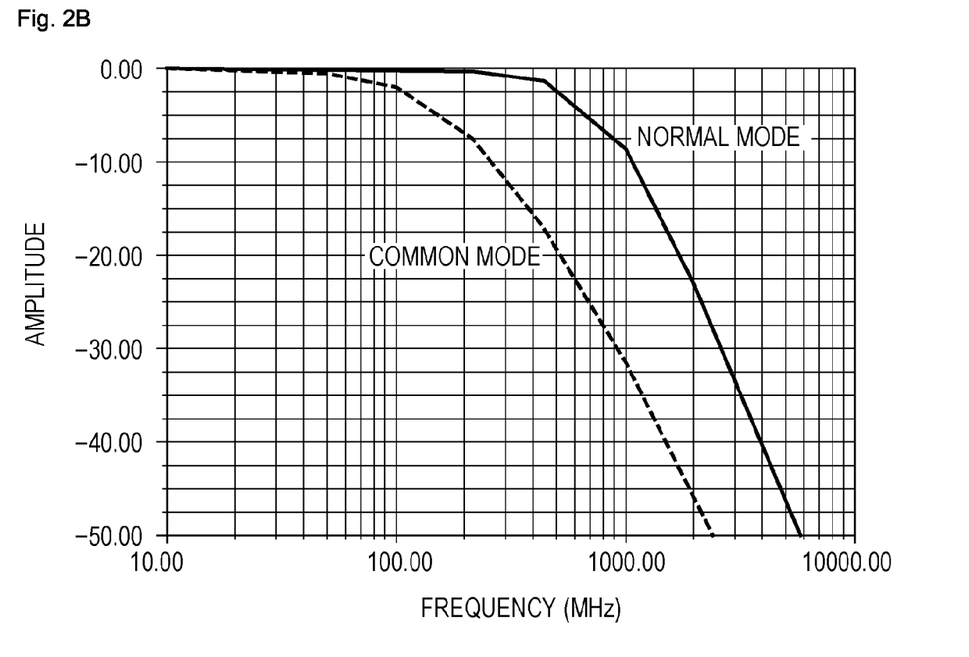
FIG. 2B is a graphic representation illustrating an attenuation frequency characteristic of the low-pass filter according to the first exemplary embodiment.

FIG. 2A and FIG. 2B are explanatory diagrams for describing a characteristic of the inductor unit 11. FIG. 2A illustrates an impedance frequency characteristic of the inductor unit 11, and FIG. 2B illustrates an attenuation frequency characteristic of the low-pass filter 6. As illustrated in FIG. 2A, regarding the inductor unit 11 functioning as a common mode choke coil, with respect to the common mode component, an impedance (broken line) of the inductor unit 11 tends to be higher than an impedance (solid line) with respect to the normal mode component. For that reason, as illustrated in FIG. 2B, the common mode component has a larger attenuation than the normal mode component. In the example of FIG. 2A, the impedance with respect to the common mode component indicates a value approximately 10 times as high as the impedance with respect to the normal mode component, and it is found out that the large attenuation occurs with respect to the common mode component.

Therefore, according to the first exemplary embodiment, since the first inductor 14 and the second inductor 15 function as the common mode choke coil through the magnetic coupling, it is possible to largely attenuate the common mode component including a low frequency band (frequency band of the first envelope).

In particular, in a case where the first inductor 14 and the second inductor 15 are magnetically coupled to each other, it is possible to increase the attenuation amount of the common mode component in the low frequency band as compared with a case in which the first inductor 14 and the second inductor 15 are not magnetically coupled to each other.

Figure 3A:
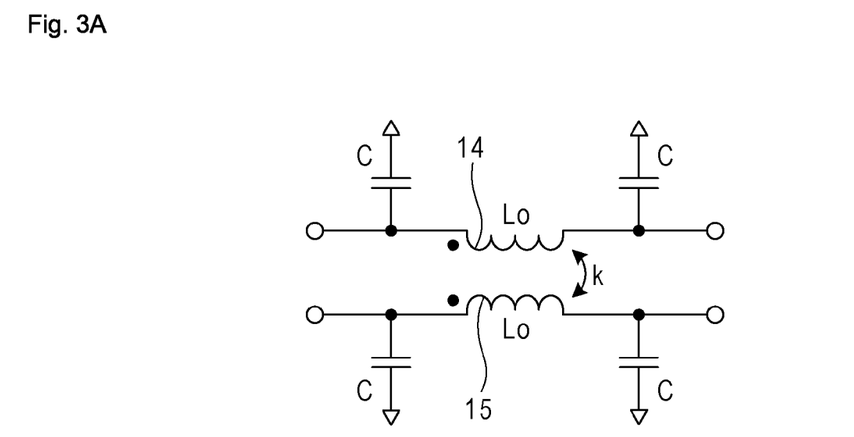
FIG. 3A is a circuit diagram of a configuration of a low-pass filter according to the first exemplary embodiment.

To describe the characteristic of the low-pass filter composed of the magnetically coupled inductance, only a part of the low-pass filter 6 of FIG. 1 is illustrated in FIG. 3A. In FIG. 3A, an inductance value of the first inductor 14 and the second inductor 15 is denoted by Lo, a coupling coefficient of the first inductor 14 and the second inductor 15 is denoted by k, and capacitance values of the four capacitances 16, 17, 18, and 19 are all denoted by C.

An inductance Ln with respect to the normal mode when the inductance having the value of Lo is coupled at the coupling coefficient k is represented as follows.

$Ln=(1-k)Lo$

Also, similarly, an inductance value Lc with respect to the common mode is represented as follows.

$Lc=(1+k)Lo$

From the two expressions, a relationship between Lc and Ln is represented as follows.

$$Lc = \frac{1+k}{1-k} Ln \quad \text{[Math. 1]}$$

Since the coupling coefficient k has a value between 0 and 1, it is found out that Lc>Ln is regularly established, and if k is increased, the inductance value Lc with respect to the common mode is increased.

According to the configuration of FIG. 3A, the inductance value Lo in a state in which the coupling does not exist (k=0) at the cutoff frequency 500 MHz and the differential impedance 100 ohm is set as 32 nH, and the value of C of the four capacitances is set as 6.4 pF. When k>0 is established, Lo is decided so that the inductance Ln with respect to the normal mode is regularly at 32 nH. This is because the characteristic of the filter with respect to the normal mode is regularly set to be constant.

Figure 3B:
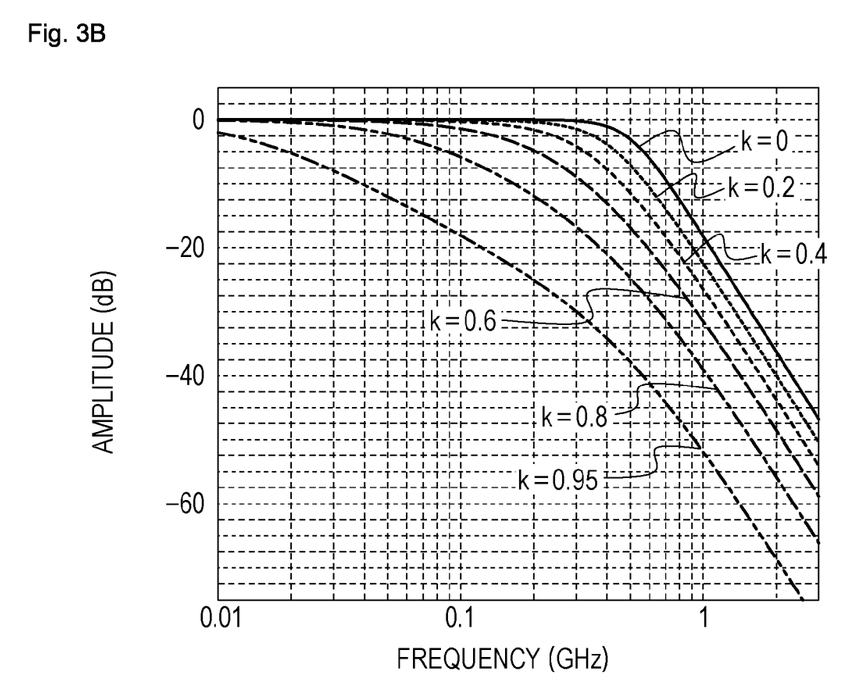
FIG. 3B is a graphic representation illustrating a character of the low-pass filter according to Example 1.

FIG. 3B illustrates an attenuation characteristic of the common mode component with respect to the change in the coupling coefficient k at this time. When the coupling coefficient k is changed, the attenuation characteristic with respect to the normal mode is controlled to be in a state of k=0 as illustrated in FIG. 3B. When the coupling coefficient k=0.4 is established, the attenuation amount in the common mode at the cutoff frequency 500 MHz is larger by 10 dB as compared with the normal mode. To elaborate, it is found out that the common mode component unused for the transmission can be suppressed also at a low frequency band, and the large attenuation can be obtained with respect to the spectrum of the typical common mode component generated from the transmission signal illustrated in FIG. 8B.

Also, furthermore, it is found out that by setting the coupling coefficient k to be larger than 0.4, the attenuation is not applied to the normal mode signal lower than or equal to the cutoff frequency, and the large attenuation larger than or equal to 10 dB can be applied to the common mode.

Therefore, since the attenuation can be substantially applied also as the entirety of the common mode component, it is possible to secure the quality of the transmitted signal and also effectively reduce the unwanted radiation noise. In particular, according to the present first exemplary embodiment, since the low-pass filter 6 is provided between the differential signal transmission unit 1 and the cables 3c and 4c, it is possible to effectively reduce the radiation noise from the cables 3c and 4c.

It is noted that the coupling coefficient k can be obtained from a self inductance Lo and a mutual inductance M. The inductance value L with the coupling is represented while using a self inductance L1 of the first inductor, a self inductance L2 of the second inductor, and a mutual inductance M as follows.

$$L = L_1 + L_2 \pm 2M$$

Herein, the mutual inductance M is represented as follows.

$$M = k\sqrt{L_1 L_2} \quad \text{[Math. 3]}$$

$$k = \frac{M}{\sqrt{L_1 L_2}} \quad \text{[Math. 4]}$$

In the case of L1=L2=Lo, the following expression is established.

$$k = \frac{M}{L_0} \quad \text{[Math. 5]}$$

Therefore, by the actual inductance value L, the self inductance L1 of the first inductor, and the inductance L2 of the second inductor, it is possible to obtain the coupling coefficient k.

Incidentally, according to the first exemplary embodiment, an electrostatic capacitance of the input-side capacitor unit 12 (a serial combined capacitance of the input-side capacitor unit 12) is set to be larger than an electrostatic capacitance of the output-side capacitor unit 13 (a serial combined capacitance of the output-side capacitor unit 13). To elaborate, a serial combined capacitance of the first and second input-side capacitances 16 and 17 is set to be larger than a serial combined capacitance of the first and second output-side capacitances 18 and 19. According to this, the common mode component included in the differential signal easily flows into the ground GND1 via the first and second input-side capacitances 16 and 17, and it is possible to effectively attenuate the common mode component in the differential signal.

Second Exemplary Embodiment

Figure 4:
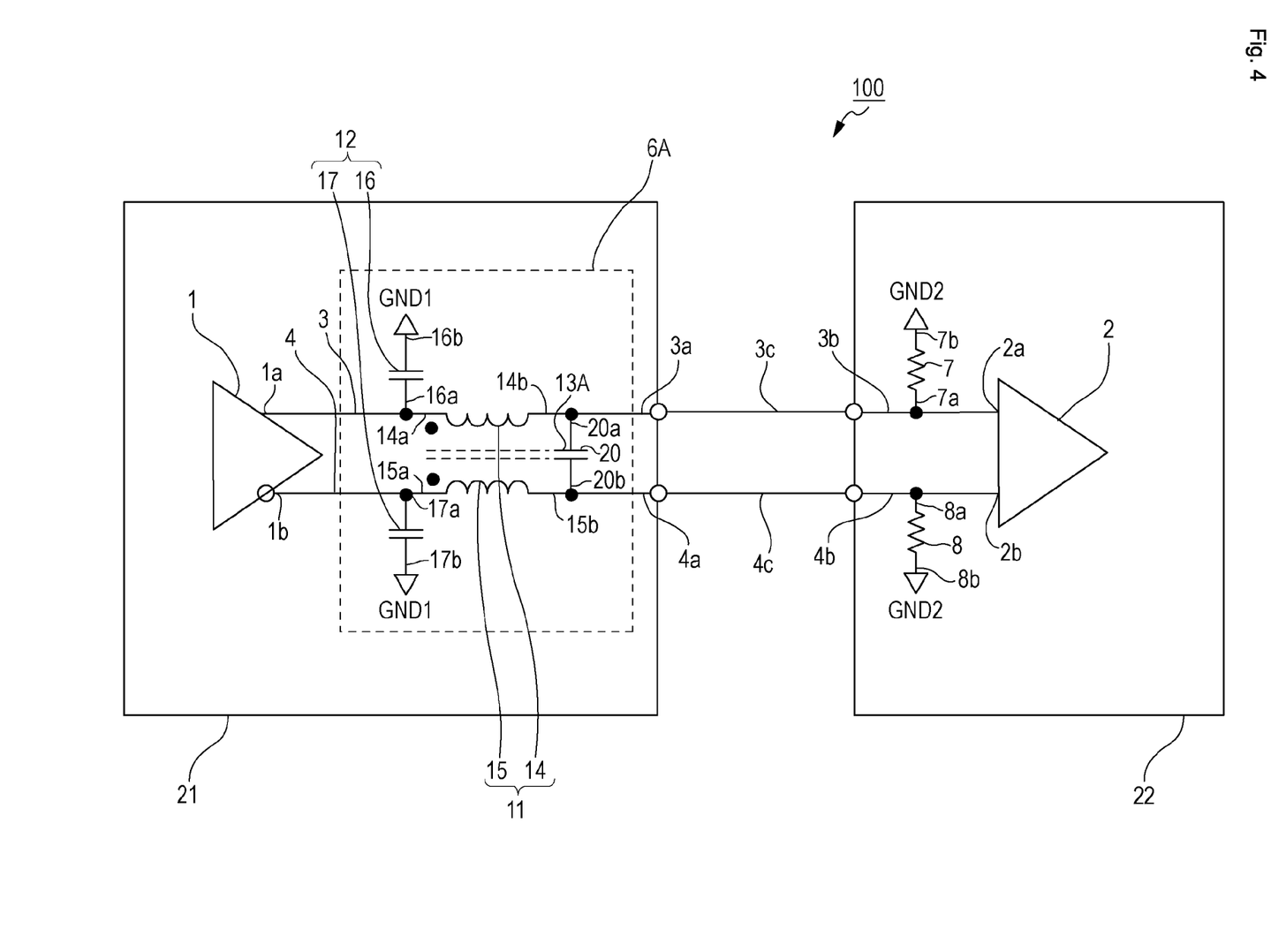
FIG. 4 is a circuit diagram of a schematic configuration of a differential transmission circuit according to a second exemplary embodiment.

Next, a differential transmission circuit according to a second exemplary embodiment of the present invention will be described. FIG. 4 is a circuit diagram of a schematic configuration of the differential transmission circuit according to the second exemplary embodiment of the present invention. It is noted that in FIG. 4, components that are same as the differential transmission circuit according to the above-described first exemplary embodiment are assigned with the same reference signs, and a detailed description thereof will be omitted.

A differential transmission circuit 100A according to the present second exemplary embodiment is structured in a manner that an output-side capacitance 20 equivalent to a serial composition of the output-side capacitances 18 and 19 is inserted between the pair of signal lines 3 and 4 in the differential transmission circuit 100 according to the above-described first exemplary embodiment illustrated in FIG. 1. For a specific description, a low-pass filter 6A of the differential transmission circuit 100A according to the present second exemplary embodiment is provided with an output-side capacitor unit 13A instead of the output-side capacitor unit 13 according to the above-described first exemplary embodiment. The output-side capacitor unit 13A is composed of the output-side capacitance 20 provided between the inductor unit 11 and the differential signal reception unit 2. To be more specific, in the output-side capacitance 20, a terminal (one terminal) 20a is electrically connected to a signal output terminal 14b of the first inductor 14, and a different terminal (the other terminal) 20b is electrically connected to a signal output terminal 15b of the second inductor 15.

It is noted that the output-side capacitance 20 may be a capacitance element mounted to the printed wiring board 21 or a capacitance pattern formed of a conductive pattern on the printed wiring board 21. Also, the output-side capacitance 20 may be a single capacitance element or capacitance pattern or may function as a single capacitance by connecting plural capacitance elements or plural capacitance patterns in parallel or in serial.

With the above-described configuration, the low-pass filter 6A functions as a pair of pi-type filters with respect to the normal mode component. For a specific description, in a case where the output-side capacitance 20 is regarded as the two serial capacitances, it is conceivable that a connecting point of the mutual serial capacitances is virtually grounded. The first signal line 3 functions as the pi-type filter with one of the capacitances when the first input-side capacitance 16, the first inductor 14, and the output-side capacitance 20 are regarded as the serial capacitance. Also, the second signal line 4 functions as the pi-type filter with one of the capacitances when the second input-side capacitance 17, the second inductor 15, and the output-side capacitance 20 are regarded as the serial capacitance. Therefore, with respect to the normal mode component, a high frequency band (a frequency band higher than the first envelope) can be effectively attenuated.

As described above, according to the second exemplary embodiment, an effect similar to the above-described first exemplary embodiment is exhibited and also the number of parts can be reduced. In addition, the unbalance of the circuits because of the fluctuation between the capacitances is reduced, and further, an effect of suppressing the generation of the common mode component in the low-pass filter 6A is suppressed is obtained.

Also, according to the second exemplary embodiment too, an electrostatic capacitance of the input-side capacitor unit 12 is set to be larger than an electrostatic capacitance of the output-side capacitor unit 13A. To be specific, a serial combined capacitance of the first and second capacitances 16 and 17 is set to be larger than the electrostatic capacitance of the output-side capacitance 20. According to this, the common mode component included in the differential signal easily flows into the ground GND1 via the first and second input-side capacitances 16 and 17, and it is possible to effectively attenuate the common mode component in the differential signal.

It is noted that the present invention is not limited to the above-described embodiments, and many variations can be made within the technical idea of the present invention by those with ordinary intelligence in this field.

According to the first and second exemplary embodiments described above, the case in which the differential signal transmission unit and the differential signal reception unit are mounted on the mutually different printed wiring boards to be connected to each other by the cable has been described but is not limited to this. A similar effect is exhibited also in a case where the differential signal transmission unit and the differential signal reception unit are mounted on the same printed wiring board.

EXAMPLES

Example 1

In the configuration of FIG. 1, electrostatic capacitances of the capacitances 16, 17, 18, and 19 are all set as 8 pF, and reactance characteristics of the inductors 14 and 15 are set as illustrated in FIG. 2A and FIG. 2B. In addition, differential characteristic impedances of the cables 3c and 4c are set as 100 ohm, and resistance values of the terminating resistors 7 and 8 are both set as 50 ohm. With the above-descried settings, characteristics with respect to the normal mode component and the common mode component are obtained by way of simulations.

Figure 5A:
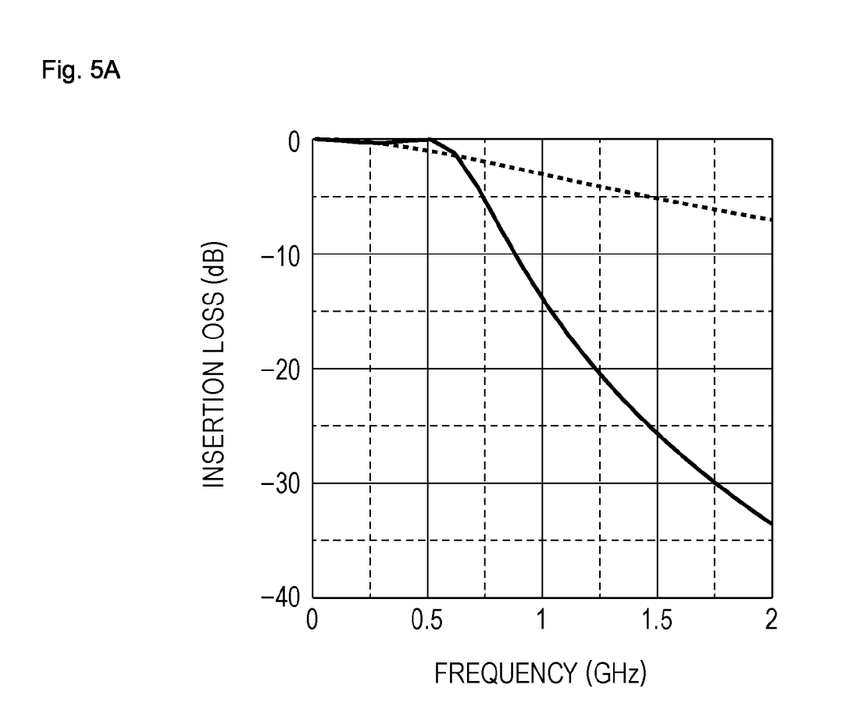
FIG. 5A is a graphic representation illustrating a simulation result of a character of a differential transmission circuit according to Example 1.

FIG. 5A illustrates a frequency-amplitude characteristic with respect to the normal mode component in the differential signal by using the above-described element value. In FIG. 5A, a broken line represents a characteristic at a time when only the inductor unit 11 exists without arranging the capacitances 16, 17, 18, and 19. In FIG. 5A, a solid line represents a characteristic at a time when the capacitances 16, 17, 18, and 19 are arranged to structure the low-pass filter 6. From the characteristic illustrated in FIG. 5A, when the above-described element value is set in the configuration of the present Example 1, in a case where the signal having the maximum frequency of the first envelope at 500 MHz is transmitted, it is found out that the component at 500 MHz or higher which is unused for the transmission can be effectively suppressed.

Figure 5B:
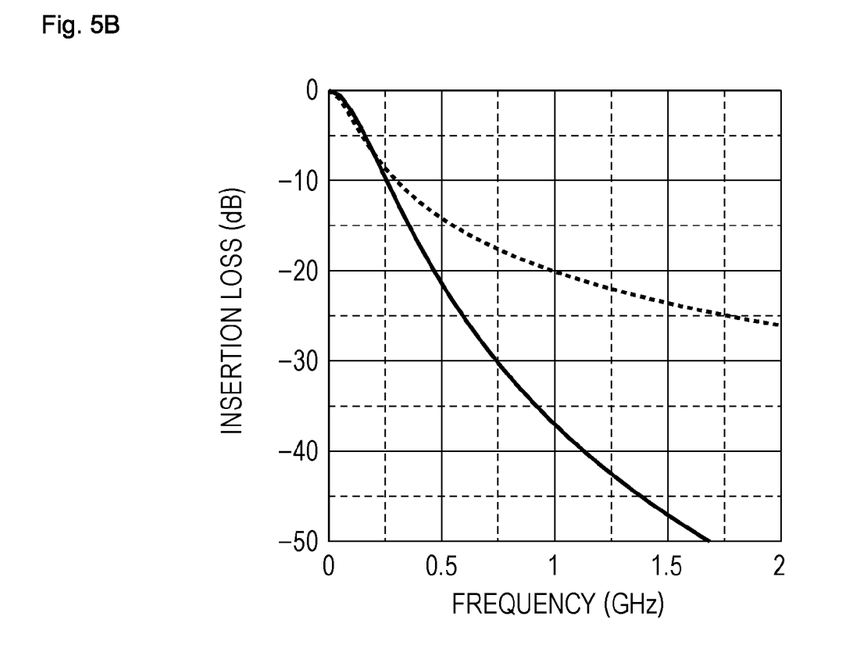
FIG. 5B is a graphic representation illustrating a simulation result of the character of the differential transmission circuit according to Example 1.

In addition, FIG. 5B illustrates a frequency-amplitude characteristic with respect to the common mode component in the differential signal by using the above-described element value. In FIG. 5B, a broken line represents a characteristic at a time when only the inductor unit 11 exists without arranging the capacitances 16, 17, 18, and 19. In FIG. 5B, a solid line represents a characteristic at a time when the capacitances 16, 17, 18, and 19 are arranged to structure the low-pass filter 6. From the characteristic illustrated in FIG. 5B, when the above-described element value is set in the configuration of the present Example 1, it is found out that the common mode component unused for the transmission can be effectively suppressed.

Example 2

In the configuration of FIG. 4, capacitance values of the capacitances 16 and 17 are both set as 8 pF, a capacitance value of the capacitance 20 is set as 4 pF corresponding to the serial combined capacitance value of the capacitances 18 and 19 in FIG. 1, and reactance characteristics of the inductors 14 and 15 are set as illustrated in FIG. 2A and FIG. 2B. In addition, differential characteristic impedances of the cables 3c and 4c are set as 100 ohm, resistance values of the terminating resistors 7 and 8 are both set as 50 ohm. With the above-described settings, characteristics with respect to the normal mode component and the common mode component are obtained by way of simulations.

Figure 6:
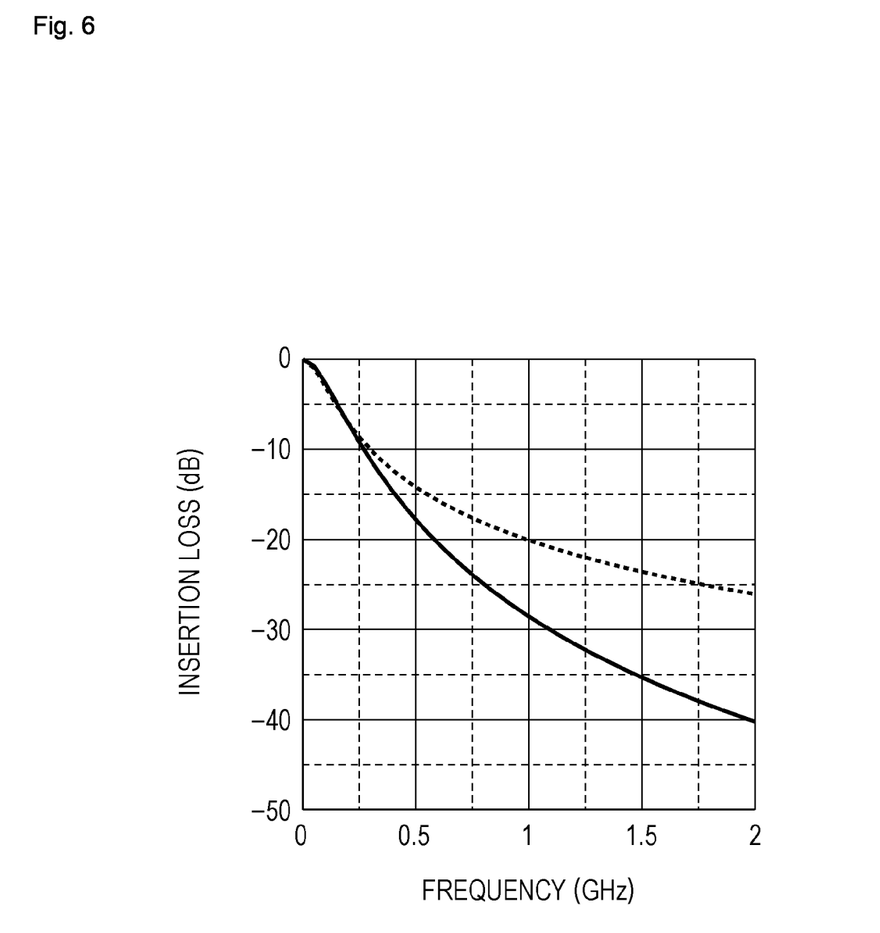
FIG. 6 is a graphic representation illustrating a simulation result of a character of a differential transmission circuit according to Example 2.

FIG. 6 illustrates a frequency-amplitude characteristic with respect to the common mode component in the differential signal by using the above-described element value. In FIG. 6, a broken line represents a characteristic at a time when only the inductor unit 11 exists without arranging the capacitances 16, 17, and 20. In FIG. 6, a solid line represents a characteristic at a time when the capacitances 16, 17, and 20 are arranged to structure the low-pass filter 6A.

From the characteristic illustrated in FIG. 6, in a case where the above-described element value is used in the configuration of the present Example 2 where the number of parts is reduced from the configuration described according to the above-described Example 1, it is found out that the common mode component unused for the transmission can be effectively suppressed.

It is noted that in a case where the configuration of the present Example 2 is adopted, the frequency-amplitude characteristic with respect to the normal mode component is the characteristic of FIG. 5A which is the same as Example 1. Therefore, in a case where the signal having the maximum frequency of the first envelope at 500 MHz is transmitted, it is found out that the component at 500 MHz or higher which is unused for the transmission can be effectively suppressed.

Example 3

A low-pass filter structured in the present Example 3 is inserted for a purpose of attenuating an unwanted spectrum in the high frequency band with respect to the normal mode component. When a digital signal passes through a circuit network such as the low-pass filter, a ringing waveform called overshoot may appear in an output waveform. A cause of this is that a characteristic of the circuit network is not a phase flat characteristic, and delay times with respect to a frequency are not fixed. The digital signal passing through the circuit network without the phase flatness may have a waveform with jitter and a closed eye.

Therefore, in the present Example 3, Bessel-type low-pass filter in which a phase characteristic with respect to a frequency is maximally flat is used as a filter for restricting a frequency band of the digital signal.

A transfer function (third order) of the Bessel-type low-pass filter is represented by the following expression.

$$H(s) = \frac{15}{s^3 + 6s^2 + 15s + 15} \quad \text{[Math. 6]}$$

As the circuit network satisfying this transfer function, four types exist. The pi-type configuration with a small inductance quantity is frequently used, and in the present Example 3 too, the circuit network of the pi-type configuration is adopted.

Figure 7A:
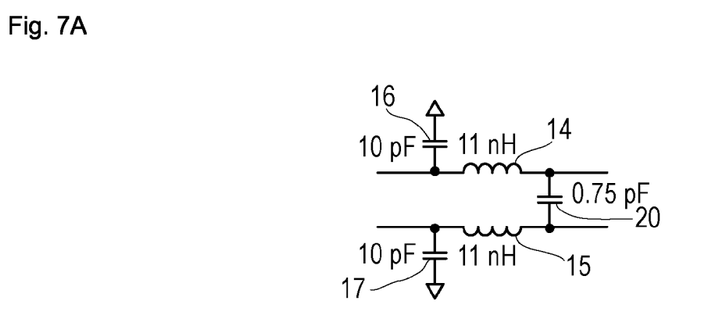
FIG. 7A is a circuit diagram of a configuration of a low-pass filter according to Example 3.
Figure 7B:
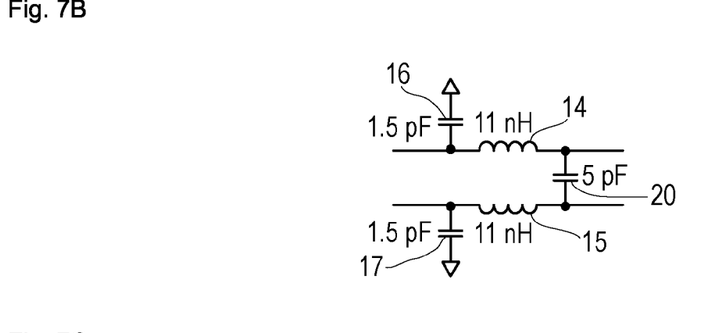
FIG. 7B is a circuit diagram of a configuration of the low-pass filter according to Example 3.

The Bessel-type low-pass filter is an input output asymmetric circuit. FIG. 7A and FIG. 7B illustrate the pi-type configuration at a time when the cutoff frequency is set as 1 GHz and the characteristic impedance is set as 50 ohm.

A difference between the low-pass filter illustrated in FIG. 7A and the low-pass filter illustrated in FIG. 7B is a numeric value of the capacitance value, but since the transfer function is the same, no difference exists in the filter transmission characteristic. The output-side capacitance 20 of the low-pass filter 6A is a high impedance with respect to the common mode component. To elaborate, a common mode current does not flow into the output-side capacitance 20.

Figure 7C:
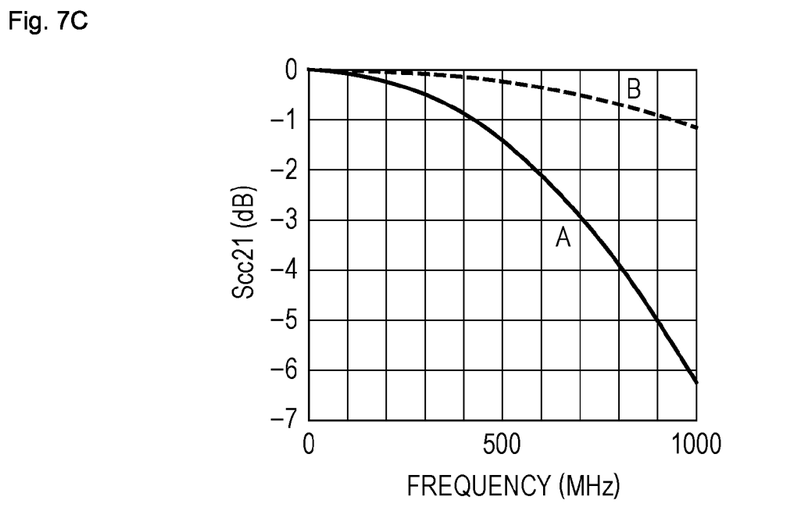
FIG. 7C is a graphic representation illustrating a simulation result of a character of the low-pass filter according to Example 3.

FIG. 7C represents a difference in a common mode attenuation characteristic based on a difference in a capacitance constant. In FIG. 7C, a solid line A illustrates a common mode component removal capability at a time when the configuration of FIG. 7A is used, and a broken line B illustrates a common mode component removal capability at a time when the configuration of FIG. 7B is used. The solid line A obtains the larger attenuation than the broken line B.

Therefore, when a consideration is given of the common mode component, by setting the serial combined capacitance of the input-side capacitances 16 and 17 close to the differential signal transmission unit 1 to be larger than the capacitance of the output-side capacitance 20, the common mode current flowing through the signal line is decreased, the radiation noise is reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-179665, filed Aug. 19, 2011 and No. 2012-159460, filed Jul. 18, 2012 which are hereby incorporated by reference herein in their entirety.

The invention claimed is:

1. A differential transmission circuit for transmitting digital signals, comprising:
a differential signal transmission unit configured to transmit a differential signal;
a differential signal reception unit configured to receive the differential signal;
a differential signal wiring composed of a first signal line and a second signal line connecting the differential signal transmission unit and the differential signal reception unit to each other;
an inductor unit composed of a first inductor provided on the first signal line and a second inductor provided on the second signal line;
an input-side capacitor unit composed of a first input-side capacitor in which one terminal is connected to a signal input terminal of the first inductor and the other terminal is connected to ground and a second input-side capacitor in which one terminal is connected to a signal input terminal of the second inductor and the other terminal is connected to ground; and
an output-side capacitor unit provided between the inductor unit and the differential signal reception unit and configured to attenuate a normal mode component included in the differential signal in cooperation with the inductor unit and the input-side capacitor unit,
wherein the first inductor and the second inductor are magnetically coupled to each other, and
wherein the magnetic coupling between the first inductor and the second inductor has a coupling coefficient k higher than or equal to 0.4.

2. A differential transmission circuit for transmitting digital signals, comprising:
a differential signal transmission unit configured to transmit a differential signal;
a differential signal reception unit configured to receive the differential signal;
a differential signal wiring composed of a first signal line and a second signal line connecting the differential signal transmission unit and the differential signal reception unit to each other;
an inductor unit composed of a first inductor provided on the first signal line and a second inductor provided on the second signal line;
an input-side capacitor unit composed of a first input-side capacitor in which one terminal is connected to a signal input terminal of the first inductor and the other terminal is connected to ground and a second input-side capacitor in which one terminal is connected to a signal input terminal of the second inductor and the other terminal is connected to ground; and
an output-side capacitor unit provided between the inductor unit and the differential signal reception unit and configured to attenuate a normal mode component included in the differential signal in cooperation with the inductor unit and the input-side capacitor unit,
wherein the first inductor and the second inductor are magnetically coupled to each other, and
wherein an electrostatic capacitance of the input-side capacitor unit is larger than an electrostatic capacitance of the output-side capacitor unit.

3. A printed circuit board comprising:
a printed wiring board;
a semiconductor element mounted to the printed wiring board and configured to transmit a digital differential signal;
a differential signal wiring formed on the printed wiring board and composed of a first signal line and a second signal line which are connected to the semiconductor element;

an inductor unit formed on the printed wiring board and composed of a first inductor provided on the first signal line and a second inductor provided on the second signal line;

an input-side capacitor unit formed on the printed wiring board and composed of a first input-side capacitor in which one terminal is connected to a signal input terminal of the first inductor and the other terminal is connected to ground and a second input-side capacitor in which one terminal is connected to a signal input terminal of the second inductor and the other terminal is connected to ground; and an output-side capacitor unit provided on an opposite side with respect to the semiconductor element as viewed from the inductor unit and configured to attenuate a normal mode component included in a digital differential signal in cooperation with the inductor unit and the input-side capacitor unit, wherein the first inductor and the second inductor are magnetically coupled to each other.

4. The printed circuit board according to claim 3, wherein the output-side capacitor unit is composed of a first output-side capacitor in which one terminal is connected to a signal output terminal of the first inductor and the other terminal is connected to ground and a second output-side capacitor in which one terminal is connected to a signal output terminal of the second inductor and the other terminal is connected to ground.

5. The printed circuit board according to claim 3, wherein the output-side capacitor unit is composed of an output-side capacitor in which one terminal is connected to a signal output terminal of the first inductor and the other terminal is connected to a signal output terminal of the second inductor.

6. The printed circuit board according to claim 3, wherein the magnetic coupling between the first inductor and the second inductor has a coupling coefficient k higher than or equal to 0.4.

7. The printed circuit board according to claim 3, wherein an electrostatic capacitance of the input-side capacitor unit is larger than an electrostatic capacitance of the output-side capacitor unit.

* * * * *